United States Patent
Tamata et al.

(10) Patent No.: US 7,295,096 B2
(45) Date of Patent: Nov. 13, 2007

(54) INDUCTOR, RESONANT CIRCUIT, SEMICONDUCTOR INTEGRATED CIRCUIT, OSCILLATOR, AND COMMUNICATION APPARATUS

(75) Inventors: Mitsuru Tamata, Osaka (JP); Mutsumi Hamaguchi, Nara (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 7 days.

(21) Appl. No.: 11/296,428

(22) Filed: Dec. 8, 2005

(65) Prior Publication Data

US 2006/0125589 A1 Jun. 15, 2006

(30) Foreign Application Priority Data

Dec. 10, 2004 (JP) ............................. 2004-358975

(51) Int. Cl.
*H01F 5/00* (2006.01)
(52) U.S. Cl. ...................... 336/200; 336/232; 336/223
(58) Field of Classification Search ................ 336/200, 336/232, 223
See application file for complete search history.

(56) References Cited

U.S. PATENT DOCUMENTS

| 5,446,311 | A | 8/1995 | Ewen et al. |
| 6,093,599 | A * | 7/2000 | Lee et al. .................... 438/238 |
| 6,420,773 | B1 * | 7/2002 | Liou .......................... 257/531 |
| 6,486,534 | B1 * | 11/2002 | Sridharan et al. ........... 257/659 |
| 7,151,011 | B2 * | 12/2006 | Sridharan et al. ........... 438/108 |
| 2002/0008301 | A1 * | 1/2002 | Liou et al. .................. 257/531 |

FOREIGN PATENT DOCUMENTS

| JP | 08-097377 A | 4/1996 |
| JP | 2003-068862 A | 3/2003 |

* cited by examiner

*Primary Examiner*—Anh Mai
(74) *Attorney, Agent, or Firm*—Birch, Stewart, Kolasch & Birch, LLP (57) ABSTRACT

An inductor of the present invention includes a plurality of insulating layers being stacked and coil patterns respectively provided on predetermined layers of the insulating layers. The coil patterns are provided on at least two of the insulating layers, and electrically connected to each other. With this arrangement, it is possible to improve Q of the inductor without increasing the size of the inductor.

9 Claims, 11 Drawing Sheets

METAL WIRES 22 TO 24

METAL WIRE 21

|  | ① PRESENT INVENTION | ② STRUCTURE WITH ONLY MULTILAYERED METAL WIRES | ③ CONVENTIONAL STRUCTURE |
|---|---|---|---|
| L[nH] | 4 | 4 | 4 |
| C[fF] | 600 | 600 | 300 |
| Rl[ohm] | 2 | 2 | 4 |
| RC[ohm] | 1.00E-02 | 3.00E+02 | 3.00E+02 |
| freq[GHz] | 1 | 1 | 1 |
| Cv[pF] | 5.96 | 6.28 | 6.33 |
| C'[pF] | 6.56 | 6.56 | 6.56 |
| Rc'[ohm] | 8.36E-05 | 1.1 | 0.475 |
| Qtank | 12.3 | 7.96 | 5.464 |

FIG. 13

METAL WIRES 21 TO 24

INDUCTOR, RESONANT CIRCUIT, SEMICONDUCTOR INTEGRATED CIRCUIT, OSCILLATOR, AND COMMUNICATION APPARATUS

This Nonprovisional application claims priority under 35 U.S.C. § 119(a) on Patent Application No. 358975/2004 filed in Japan on Dec. 10, 2004, the entire contents of which are hereby incorporated by reference.

FIELD OF THE INVENTION

The present invention relates to (i) a spiral inductor which is constructed by a manufacturing process of a semiconductor device, (ii) a resonator and an oscillator both of which include the spiral inductor (e.g. voltage controlled resonant circuit), and (iii) a communication apparatus (e.g. wireless apparatus, high-frequency transmitting and receiving apparatus), (iv) and the like.

BACKGROUND OF THE INVENTION

Voltage controlled oscillating circuits are used as local oscillation sources in tuners for satellite broadcasts or tuners for cable television broadcasts. The voltage controlled oscillating circuit includes a resonant circuit having a variable capacitance device, and a negative resistance circuit section having an active component. The voltage controlled oscillating circuit oscillates a predetermined frequency (resonance frequency) according to a controlled voltage applied to the variable capacitance device.

One indicator for the performance capabilities of the voltage controlled oscillating circuit is phase noise (unwanted energy generated in the vicinity of output frequency). The phase noise is affected by Q of the resonant circuit. That is, the higher Q the resonant circuit has, the greater difference is provided between the signal level and the noise level, enabling reduction in the phase noise.

Figure 18:
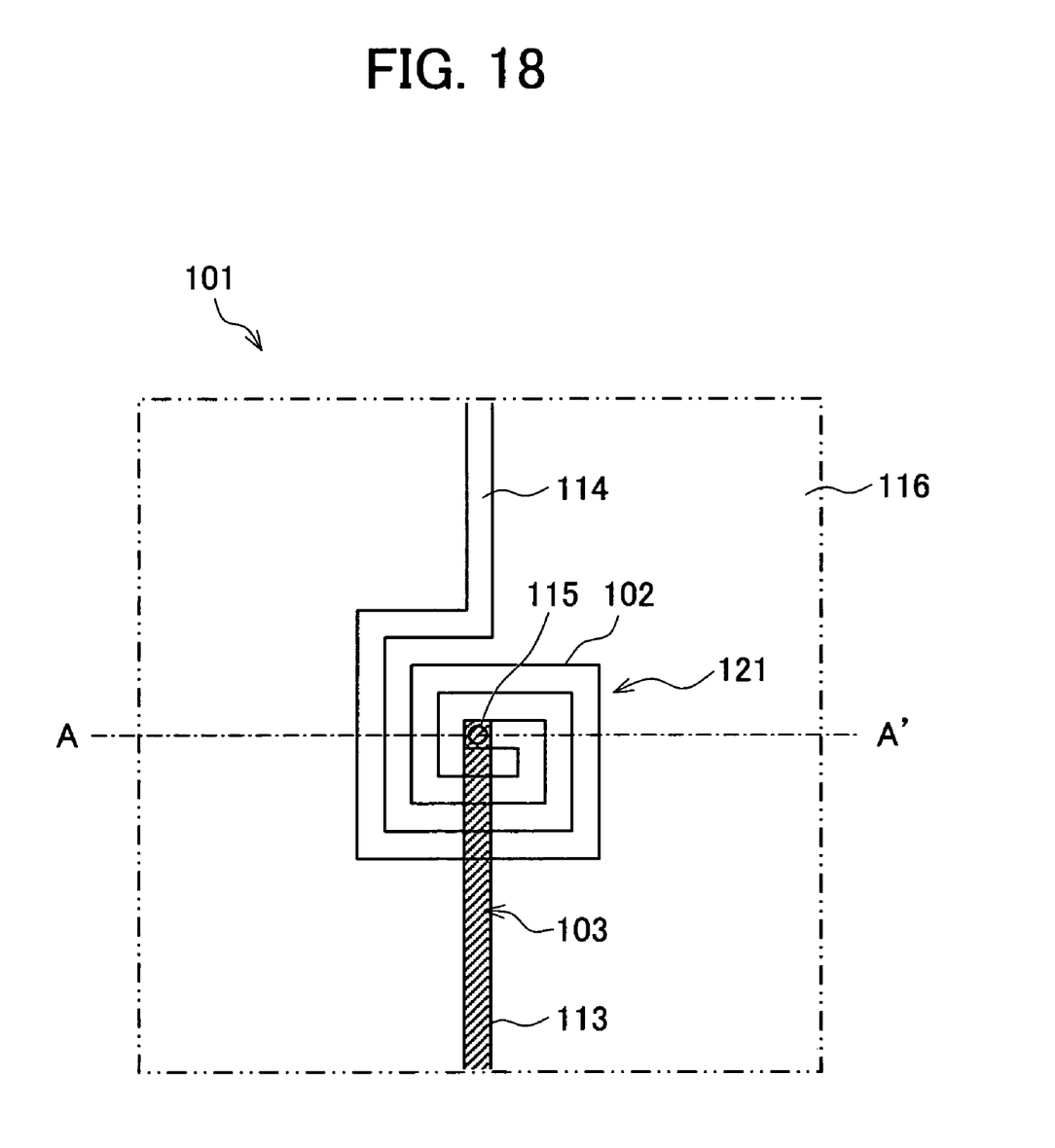
FIG. 18 is a top view illustrating a structure of a conventional inductor.
Figure 19:
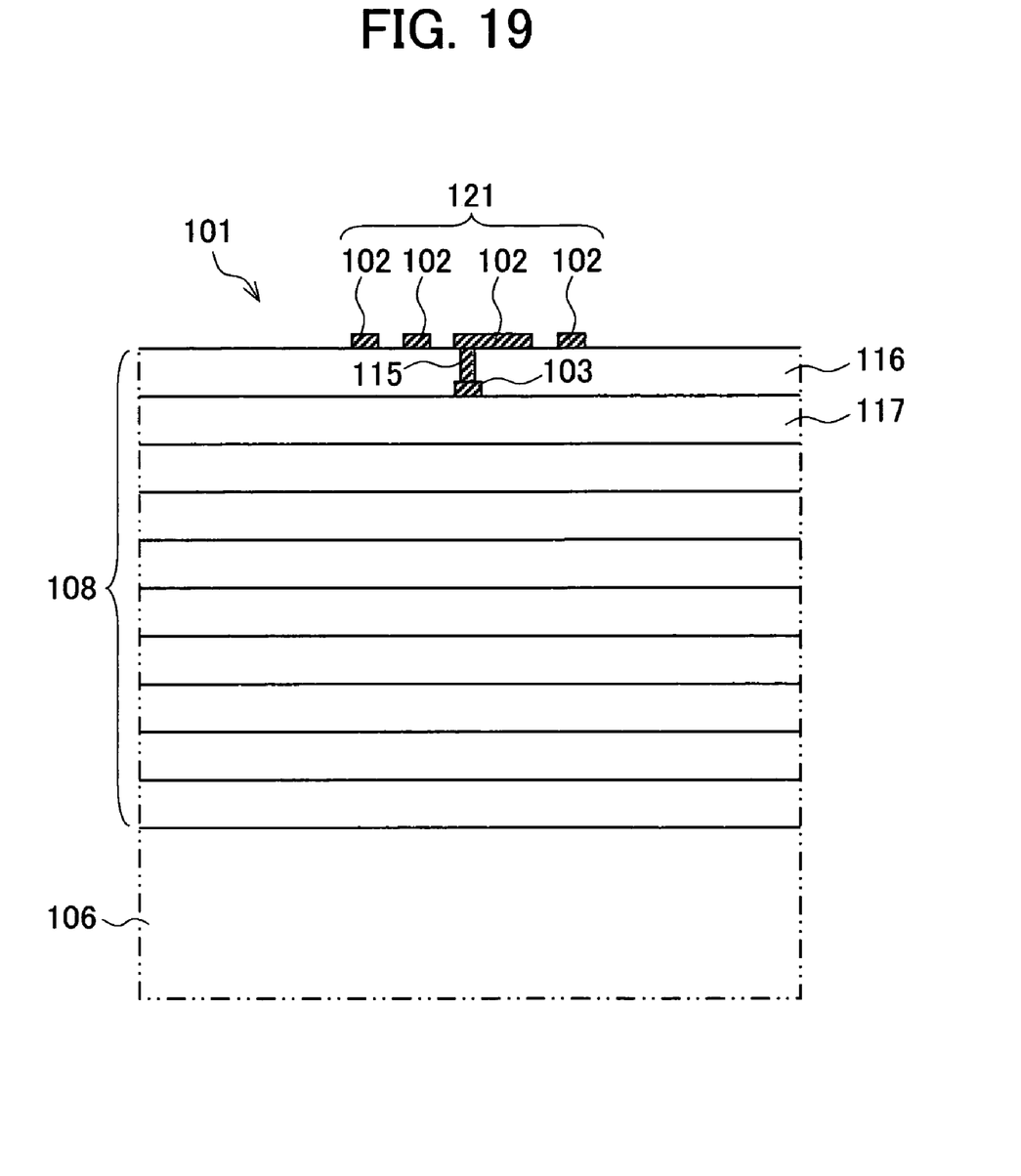
FIG. 19 is a cross-sectional view illustrating a structure of the conventional inductor.

FIGS. 18 and 19 illustrate exemplary structures of a conventional inductor, which has multilevel wiring and is used in the resonant circuit. FIG. 18 is a top view of the conventional inductor, and FIG. 19 is a cross-sectional view illustrating the inductor taken along line A-A' of FIG. 18.

As illustrated in FIGS. 18 and 19, an inductor 121 includes a semiconductor substrate 106, an SiO2 film (not shown) formed on the semiconductor substrate 106, a plurality of insulating layers 108, a linear wire 103, a spiral wire 102, and a through hole 115.

The insulating layers 108 are stacked on the semiconductor substrate 106, and the SiO2 film intervenes therebetween. The spiral wire 102 is formed on an insulating layer 116, i.e., an uppermost layer of the insulating layers 108. The linear wire 103 is formed on another insulating layer (an interlayer, i.e., the second insulating layer from the uppermost layer) 117. The through hole 115 serves to establish electric connection between the wire 102 and the wire 103.

As illustrated in FIG. 18, a terminal 114 of the inductor 121 is provided on leading end of the wire 102, and connected to a terminal or the like of an external circuit (not shown). Further, another terminal 113 of the inductor 121 is provided on leading end of the linear wire 103, and connected to a terminal or the like of an external circuit (not shown).

In the spiral wire 102, a resistance (wiring resistance) occurs which is in series to the wire. This will be a major cause for reduction in Q of the inductor 121, thereby reducing Q of the resonant circuit incorporating the inductor. As such, a reduction in Q of the resonant circuit causes an increase in the phase noise.

Note that, related technical art is disclosed in Japanese Unexamined Patent Publication, No. 68862/2003 (Tokukai 2003-68862, publication date: Mar. 7, 2003) and Japanese Unexamined Patent Publication, No. 97377/1996 (Tokukaihei 8-97377, publication date: Apr. 12, 1996).

As a solution for the above problem, the resistance can be reduced by making the wires of the spiral wiring to be broad in width. However, this results in increasing the area of the inductor, and further increasing the area of the circuit.

As another solution, the resistance can be reduced by forming a thick spiral wire on the uppermost insulating layer. However, this requires a special thick insulating layer, used exclusively for an inductor, to be formed on the uppermost insulating layer.

SUMMARY OF THE INVENTION

The present invention was made in view of the above problems, and an object of the present invention is to increase Q of an inductor without increasing the size of the inductor.

To solve the foregoing problems, the inductor of the present invention includes a plurality of insulating layers being stacked; and coil patterns being respectively provided on predetermined layers of the insulating layers, at least two of the insulating layers having the respective coil patterns provided thereon, the coil patterns being electrically connected to each other.

First, the coil patterns are formed on the insulating layers. The coil patterns are, for example, spiral wiring patterns.

According to the above arrangement, the coil patterns are electrically connected and stacked in multiple levels. This allows resistances (wiring resistance) applied in series to the coil patterns to be applied in a parallel manner, enabling reduction in the total series resistance of the inductor.

Here, when L is a self inductance and R1 is its series resistance, Q (good quality of the coil=a value indicating low resistance loss) of the inductor in series resonance is given as $$Q = \omega L / R1.$$

Thus, decrease of the series resistance R1 increases Q of the inductor itself. In the foregoing structure, the coil patterns are stacked in multiple levels. Therefore, an area of the circuit will not be increased, unlike the conventional technique for making the wires to be broad in width. This enables improvement in Q without increasing the size of the inductor. For example, when the inductor is used in a resonant circuit, Q of the resonant circuit (value indicating an oscillating characteristic of the resonant circuit, and sharpness of the oscillation) can be improved, enabling reduction in the phase noise of the resonant circuit.

The resonant circuit of the present invention includes: an inductor; and a variable capacitance device being provided in parallel to the inductor, the inductor including: a plurality of insulating layers being stacked; and coil patterns respectively provided on predetermined layers of the insulating layers, at least two of the insulating layers having the respective coil patterns being provided thereon, the coil patterns being electrically connected to each other.

In this manner, when the inductor of the present invention is employed in the resonant circuit, in which the variable capacitance device and the inductor are supposed to be provided in parallel, the effect of the increased parasitic capacitance due to the multilayered coil patterns is reduced. Further, reduction efficiency of the wiring resistance is significantly increased by the multilayered coil patterns. As a result, a resonant circuit is realized which has a high Q.

DESCRIPTION OF THE EMBODIMENTS

Figure 1:
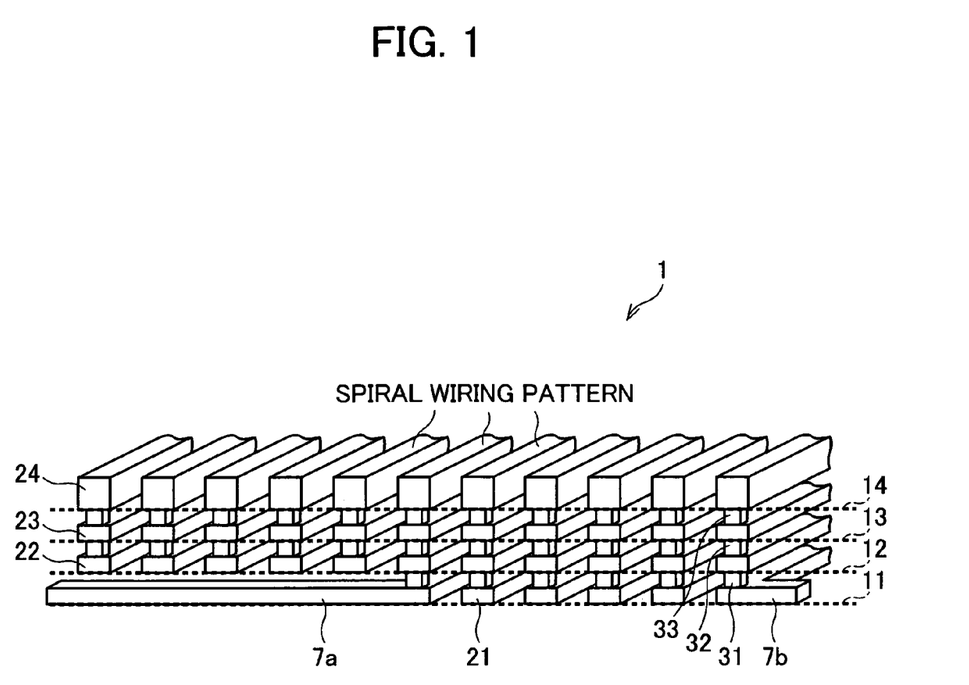
FIG. 1 is a cross-sectional perspective view illustrating a structure of an inductor of the present invention.
Figure 2:
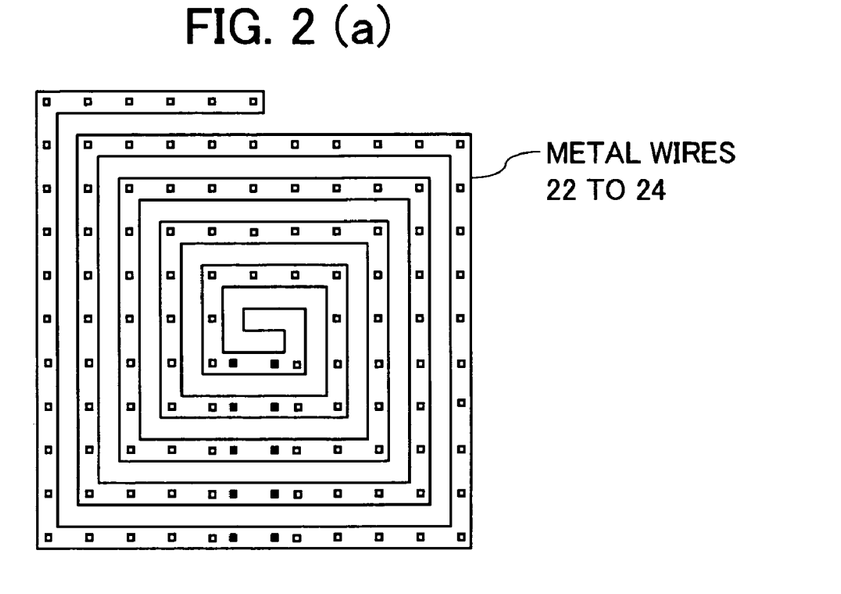
FIG. 2(a) is a plan view illustrating metal wires of the upper layers (excluding the bottom layer) of the inductor illustrated in FIG. 1.
FIG. 2(b) is a plan view illustrating a metal wire of the bottom layer of the inductor illustrated in FIG. 1.

With reference to FIGS. 1 through 17, one embodiment of the present invention is described below. FIG. 1 is a cross-sectional perspective view illustrating a structure of an inductor of the present invention. FIGS. 2(a) and 2(b) are plan views illustrating patterns of metal wires in the inductor illustrated in FIG. 1.

As illustrated in FIG. 1, an inductor 1 of the present invention includes first to fourth insulating layers 11 to 14, first to fourth metal wires 21 to 24, and first to third via holes 31 to 33.

The first to fourth insulating layers 11 to 14 are stacked on a semiconductor substrate (not shown) in the order illustrated in FIG. 1. The first metal wire 21 is formed on an upper surface of the first insulating layer 11 (a surface on the opposite side of the semiconductor substrate), and the second metal wire 22 is formed on an upper surface of the second insulating layer 12. Further, the third metal wire 23 is formed on an upper surface of the third insulating layer 13, and the fourth metal wire 24 is formed on an upper surface of the fourth insulating layer 14. Through the via holes 31, the first metal wire 21 and the second metal wire 22 are electrically connected. Further, with the via holes 32, the second metal wire 22 and the third metal wire 23 are electrically connected. Then, through the via holes 33, the third metal wire 23 and the fourth metal wire 24 are electrically connected.

As illustrated in FIG. 2(b), the first metal wire 21 is formed in a spiral pattern, and its outer edge forms a substantially square shape. The first metal wire 21 has a spiral center part (spiral end part) and a spiral start part which are connected to leads 7a and 7b, respectively. The lead 7a, connected to the spiral end part, is drawn in a direction substantially orthogonal to the windings. Further, each of the windings is separated at a part (portion where the lead 7a is supposed to cross the winding) so as not to contact the lead 7a.

As illustrated in FIG. 2(a), the second to fourth metal wires 22 to 24 are formed in the same shape. The metal wires are formed in a spiral pattern so that the outer edge forms a substantially square shape.

The metal wires 21 through 24 are connected to each other through the via holes 31 to 33, which are provided on the respective wires. Each of the via holes 31 to 33 is provided in plurality. For example, the via holes 31 are formed at regular intervals on the first metal wire 21 (bottom layer) arranged in a spiral pattern. Note that, no via hole is formed on the leads 7a and 7b. Further, the via holes 33 are formed at regular intervals on the spirally-arranged fourth metal wire 24 (uppermost layer), for example.

It should be noted that, for the first metal wire 21, no via hole is formed on the leads 7a, 7b, and their surroundings. Therefore, each of the second to fourth metal wires 22 to 24 has no via holes at parts located above the lead 7a, but has via holes (represented by black squares in the figure) formed in the surroundings of the parts located above the lead 7a. These via holes connect the second to fourth metal wires 22 to 24 exclusively. Note that, with regard to the second to fourth metal wires 22 to 24, the via holes (represented by white squares in the figure) formed in other parts than the aforementioned surroundings electrically connect the metal wires 21 to 24.

Figure 3:
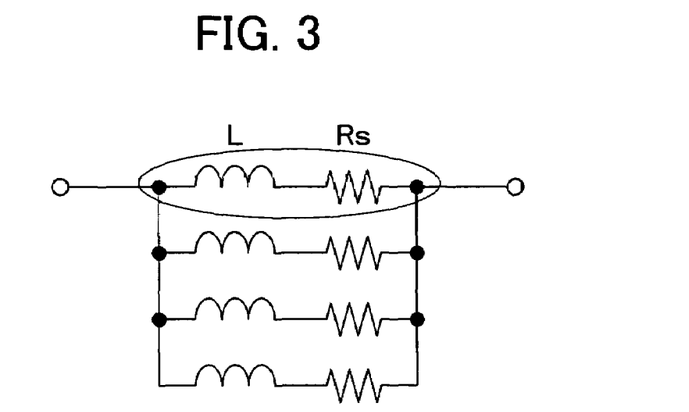
FIG. 3 is a circuit diagram schematically illustrating the stacked metal wires.

According to the present embodiment, the inductor 1 is arranged such that the metal wires 21 to 24 disposed in a spiral wiring pattern (coil patterns) are connected to each other through the via holes (connecting via holes) 31 to 33 provided on the respective wires. FIG. 3 is a circuit diagram schematically illustrating the above arrangement. That is, in each of the wires, one coil L and one resistor Rs are connected in series (e.g. a circled portion in the figure corresponds to the first metal wire 21). Assuming the series-connected coil and resistance as one set, four sets are connected in parallel.

In this manner, the metal wires are connected through the via holes, so as to be stacked in multiple levels. This allows the resistances applied in series to the metal wires to be applied in a parallel manner, enabling reduction in the total series resistance of the inductor. When L is a self inductance and R1 is its series resistance, Q of the inductor 1 in series resonance is given as $$Q = \omega L / R1.$$

Thus, Q is increased by reducing the series resistance R1.

In the inductor 1, the first insulating layer 11 is formed on the semiconductor substrate, and the first metal wire 21 is formed on the surface of the first insulating layer 11. However, as in the case of an inductor 10 illustrated in FIG. 4, it is preferable that a full-surface GND pattern be formed in between the semiconductor substrate and the first insulating layer 11 (on the surface of the semiconductor substrate, i.e., below the bottom layer of the insulating layers). Note that, the inductor 10 illustrated in FIG. 4 has the same structure as the inductor 1 illustrated in FIG. 1, with regard to the positions and connections of the insulating layers, the metal wires, and the via holes.

Figure 4:
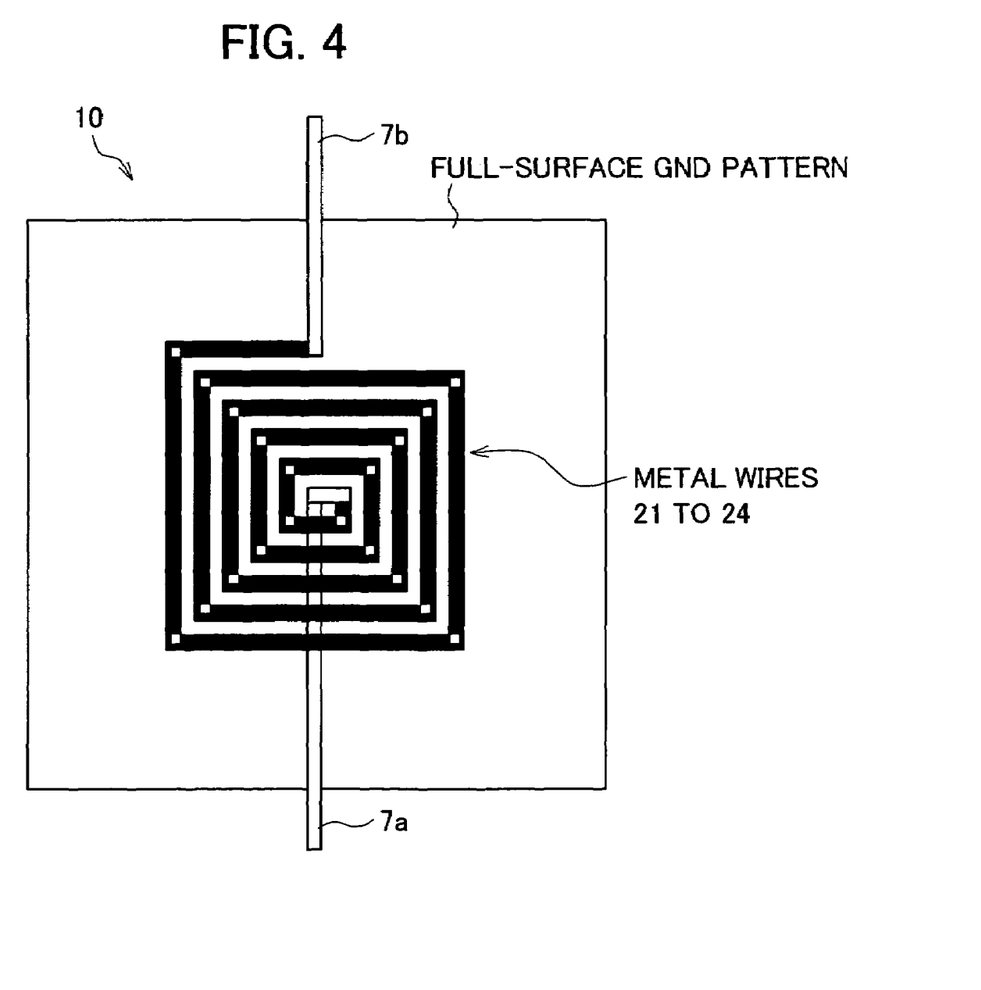
FIG. 4 is a top view of a modification example of the inductor illustrated in FIG. 1.

The inductor 10 has advantages described below.

Figure 5:
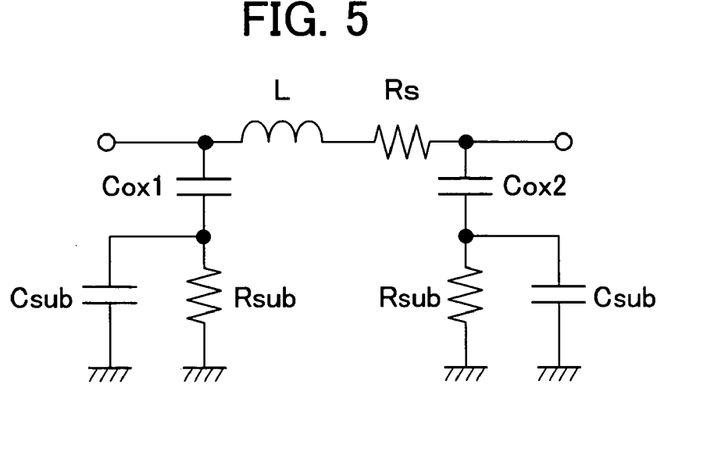
FIG. 5 is a circuit diagram illustrating the inductor of the present invention in a π-type inductor model.

For example, FIG. 5 illustrates each of the metal wires in π n inductor model, where L is a spiral-shaped metal wire, Rs is a resistance generated in the metal wire, Cox1 and Cox2 are parasitic capacitances occurred between the metal wire and the semiconductor substrate, Rsub is a resistance of the semiconductor substrate to the GND (substrate resistance), and Csub is a parasitic capacitance occurred between the GND and the semiconductor substrate. Assume that the coil L and the resistance R1 are connected in series, and P1 and P2 are provided at both ends of the series-connected coil L and the resistance R1 (the coil L and the resistor Rs are connected in series between the P1 and the P2). In this case, the P1 and one electrode of the capacitance Cox1 are connected, while the Rsub and the Csub are connected in parallel between the other electrode of the capacitance Cox1 and the GND pattern. Further, the P2 and one electrode of the capacitance Cox2 are connected, while the Rsub and the Csub are connected in parallel between the other electrode of the capacitance Cox2 and the GND pattern.

It should be noted that the Csub can be usually ignored, the both Rsub are connected via the GND, and the metal wires are stacked in multiple levels. Considering these, the inductor 10 can be illustrated based on the above model, referring to a circuit illustrated in FIG. 6. That is, the coil L and the resistance R1 are connected in series, while a capacitance C and a resistance Rc are connected in series. Further, the series-connected coil L and resistance R1 are connected in parallel to the series-connected capacitance C and resistance Rc. Note that, the Rc indicated in FIG. 6 corresponds to the substrate resistance Rsub indicated in FIG. 5, and the C indicated in FIG. 6 corresponds to the parasitic capacitances Cox1 and Cox2 indicated in FIG. 5. The resistance R1 is a resistance occurred in all of the metal wires (the first to fourth metal wires 21 through 24).

Figure 6:
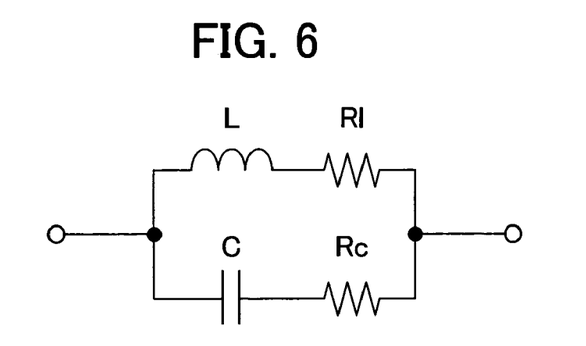
FIG. 6 is a simplified circuit diagram for use in calculating the π-type inductor model illustrated in FIG. 5.
Figure 7:
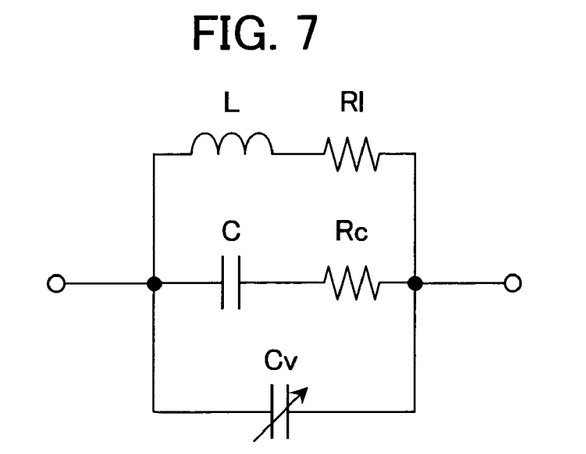
FIG. 7 is a circuit diagram for use in calculating a resonant circuit of the present invention.
Figure 8:
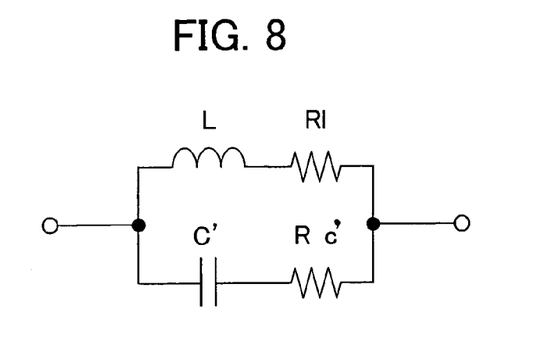
FIG. 8 is an equivalent circuit of the circuit illustrated in FIG. 7.

FIG. 7 illustrates a structure in which the inductor illustrated in FIG. 6 is connected to a variable capacitance device Cv in parallel so that a resonant circuit is constructed. That is, the series-connected coil L and resistor R1, the series-connected capacitor C and resistor Rc, and the variable capacitance device Cv are connected in parallel. Further, FIG. 8 illustrates an equivalent circuit of the structure illustrated in FIG. 7. In FIG. 8, the coil L and the resistor R1 are connected in series, while a capacitor C' and a resistor Rc' are connected in series. Further, the series-connected coil L and resistor R1 are connected in parallel to the series-connected capacitor C' and resistor Rc'.

The following describes the circuits illustrated in FIGS. 6 through 8.

First, in the circuit illustrated in FIG. 7, an admittance Y in a portion where the series-connected capacitance C and resistance Rc are connected in parallel to the variable capacitance device Cv is expressed by the following equation (1):

$$Y = \left(\frac{1}{j\omega C} + Rc\right)^{-1} + j\omega C_v \quad (1)$$

where C is a capacitance of the capacitor C, Rc is a resistance of the resistor Rc, and Cv is a capacitance of the variable capacitance device Cv.

Further, an impedance Z in a portion where the capacitor C' and the resistor Rc' are connected in series in the circuit illustrated in FIG. 8 is expressed by the following equation (2):

$$Z = A + jB = Rc' + \frac{1}{j\omega C'} \quad \left(A = Rc, \quad B = -\frac{1}{\omega C'}\right) \quad (2)$$

where C' is a capacitance of the capacitor C' and Rc' is a resistance of the resistor Rc'.

Based on the equations (1) and (2), the Rc' and the C' can be expressed by the following equations (3) and (4):

$$Rc' = \frac{C^2 Rc}{\omega^2 C^2 Cv^2 Rc^2 + (C + Cv)^2} \quad (3)$$

$$C' = \frac{\omega^2 C^2 Cv^2 R^2 c + (C + Cv)^2}{\omega^2 C^2 Cv R^2 c + (C + Cv)} \quad (4)$$

where L is a self inductance of the coil L.

Figure 9:
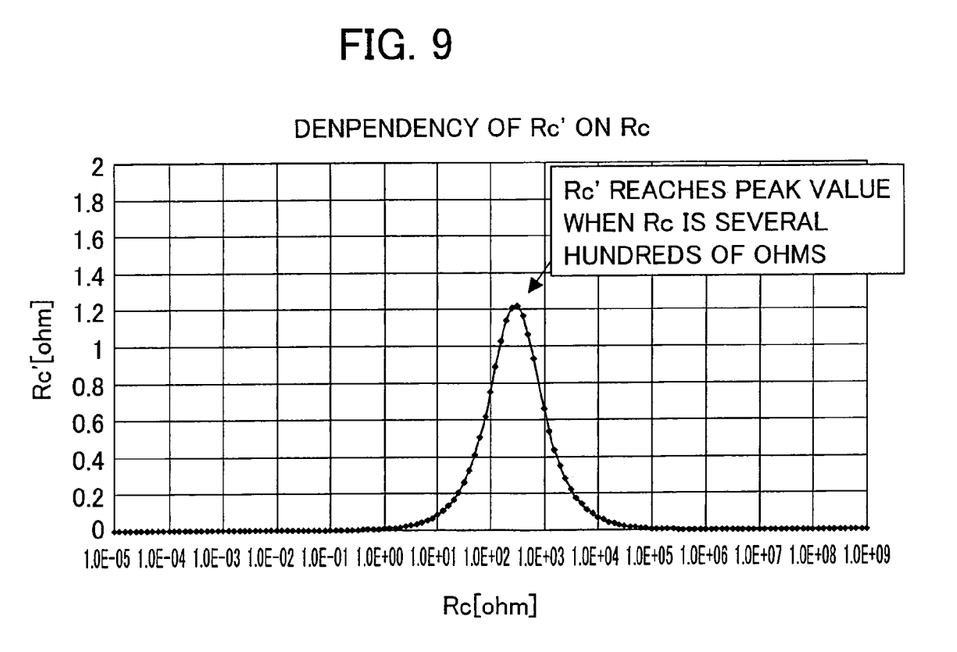
FIG. 9 is a graph representing a dependency characteristic of Rc' in the circuit illustrated in FIG. 8 on Rc in the circuit illustrated in FIG. 7.

Here, substitute the following values into the equation (3) for the Rc': a desired frequency=1.00 G[Hz]; L=4.00 n[H]; a parasitic capacitance C generated due to multilevel interconnection=600 f[F]; R1=2.00 [Ω]; and Cv=5.96 p[F]. FIG. 9 shows a resulting relationship between the Rc and the Rc'. Note that, Rc is in a range from $1.00 \times 10^{-5}$ Ω[f] to $1.00 \times 10^9$ [Ω].

As illustrated in FIG. 9, if the Rc is 1 [Ω] or smaller, it is possible to set the Rc' to be nearly 0 [Ω]. Note that, the Rc' varies in a range from 0 [Ω] to 1.20 [Ω]. When the Rc is a resistance of several hundreds of ohms, the Rc' reaches the peak value (approximately 1.22 [Ω]).

Figure 10:
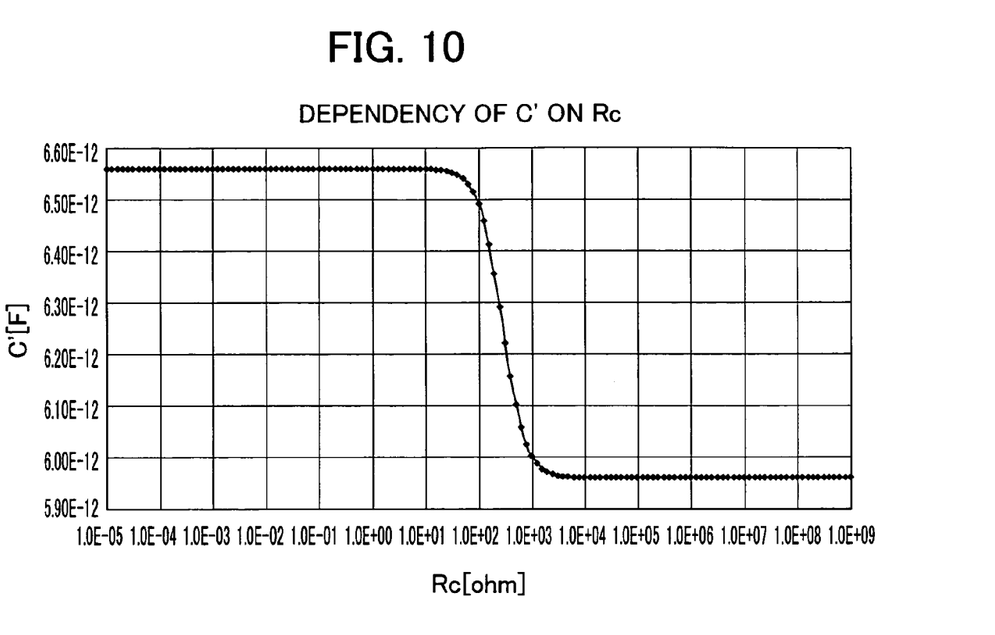
FIG. 10 is a graph representing a dependency characteristic of C' in the circuit illustrated in FIG. 8 on Rc in the circuit illustrated in FIG. 8.

In a similar manner, substitute the following values into the equation (4) for the C': a desired frequency=1.00 G[Hz]; L=4.00 n[H]; C=600 f[F]; R1=2.00 [Ω]; and Cv=5.96 p[F]. FIG. 10 shows a resulting relationship between the Rc and the C'. Note that, Rc is in a range from $1.00 \times 10^{-5}$ [Ω] to $1.00 \times 10^9$ [Ω].

As illustrated in FIG. 10, the C' varies in a range from 5.95 p[F] to 6.55 p[F]. When the Rc is several tens of ohms or smaller, the C' takes almost constant value of approximately 6.55 p[F]. When the Rc is in the vicinity of several hundreds of ohms, the C' declines sharply. Further, when the Rc is one thousand of ohms or smaller, the C' takes almost constant value of approximately 5.95 p[F].

Further, Q of the resonator is given by the following equation (5):

$$Q = R_{tot} \sqrt{\frac{C_P}{L_P}} \text{ where} \tag{5}$$

$$C_P = \frac{C}{1 + \omega^2 C^2 R_C^2} \quad L_P = \frac{R_l^2 + \omega^2 L^2}{\omega^2 L}$$

$$R_{tot} = \left(\frac{1}{R_{CP}} + \frac{1}{R_{LP}}\right)^{-1} = \frac{\frac{L}{C} + R_C R_l}{R_C + R_l}$$

Figure 11:
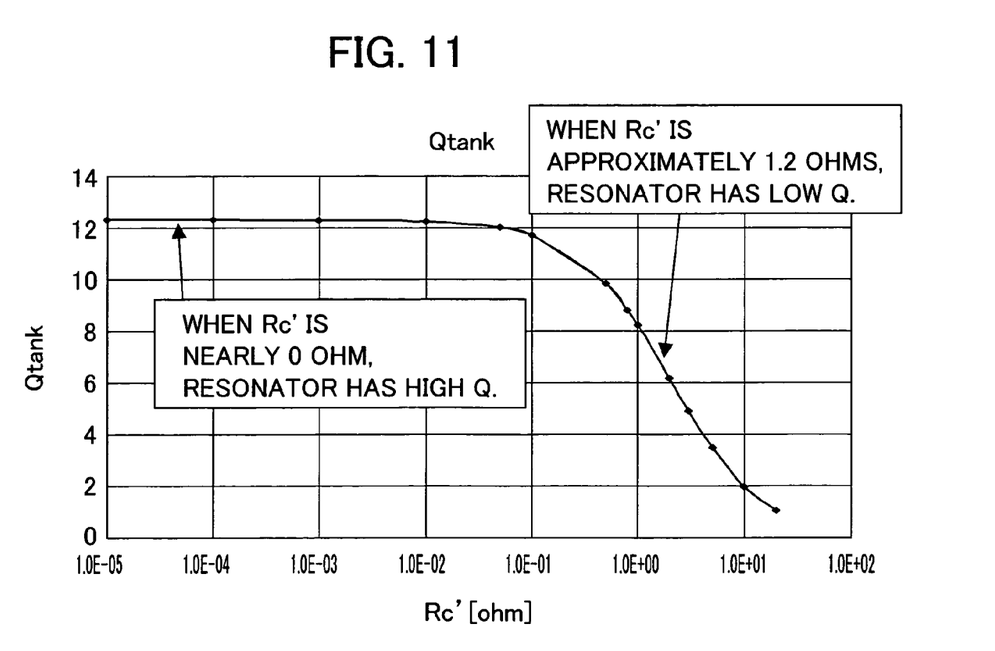
FIG. 11 is a graph representing a dependency characteristic of Q in the circuit illustrated in FIG. 8 on Rc' in the circuit illustrated in FIG. 8.

Here, substitute the following values into the above equation (5): a desired frequency=1.00 G[Hz]; L=4.00 n[H]; C=600 f[F]; R1=2.00 [Ω]; and Cv=5.96 p[F]. FIG. 11 illustrates a resulting relationship between the Rc' and the Q in the circuit illustrated in FIG. 8. Note that, Rc is in a range from $1.00 \times 10^{-5}$ [Ω] to $1.00 \times 10^{2}$ [Ω].

As illustrated in FIG. 11, the Q can be increased up to approximately 12.3, by setting the Rc' to be small (close to zero). The Rc' becomes nearly 0 [Ω], by setting the Rc to be 1.00 [Ω] or smaller (the Rc corresponds to the Rsub, i.e., resistance of the semiconductor substrate to the GND). On the other hand, when the Rc' is increased up to approximately 1.2 [Ω](several hundreds of ohms when expressed in the Rc), the Q is decreased to approximately 8.0.

The inductor 10 allows the Rc to be nearly 0 [Ω], because the full-surface GND patter is formed in between the semiconductor substrate and the first insulating layer 11 (on the surface of the semiconductor substrate, i.e., below the bottom layer of the insulating layers).

In this manner, the Q of the resonant circuit including the inductor 10 becomes greater than the Q of the resonant circuit including the inductor 1.

Figure 12:
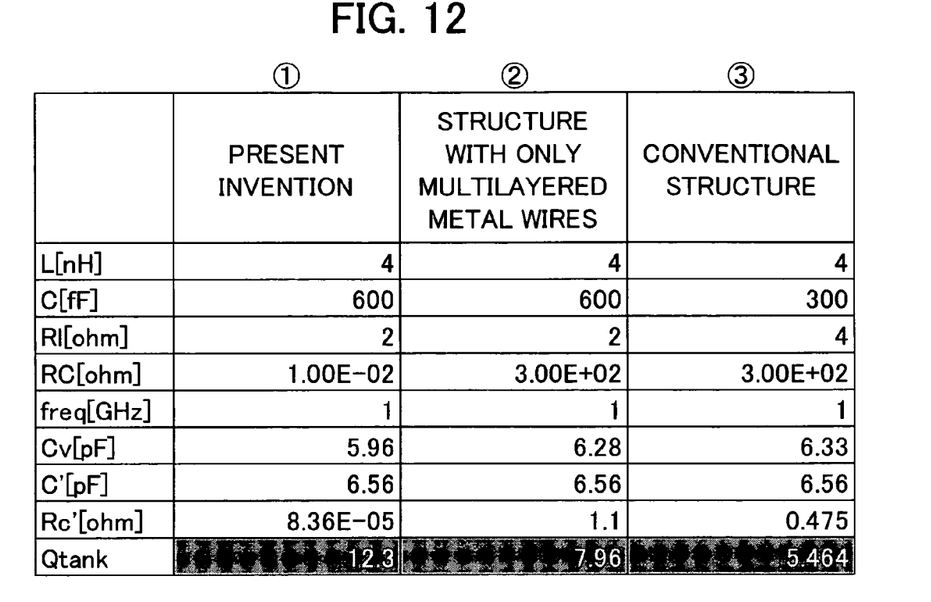
FIG. 12 is a table showing a result of comparison between the structures of the present invention and a conventional structure.

FIG. 12 illustrates comparisons among cases where (i) the inductor 10, (ii) the inductor 1, and (iii) a conventional inductor are employed in the resonant circuit. Note that, the conventional inductor has a structure illustrated in the aforementioned Patent Document 1 (see FIGS. 1 and 2).

The conventional case (iii) is set under the following conditions where: a desired frequency=1.00 G[Hz]; L=4.00 n[H]; C=300 f[F]; R1=4.00 [Ω]; a capacitance of the variable capacitance device Cv=6.33 p[F]; Rc=300 [Ω]; Rc'=0.475 [Ω] (see Equation 3); and C'=6.33 p[F] (see Equation 4). In the conventional case (iii), the metal wires are not stacked in multiple levels. Therefore, the C, derived from the parasitic capacitance of the metal wires, is smaller than the C of the case (i) and of the case (ii) of the present invention. On the other hand, the total resistance R1 of the metal wires is greater than that of the case (i) and of the case (ii). At this time, the Q of the resonant circuit is approximately 5.46.

The case (ii) of the present invention is set under the following conditions where: a desired frequency=1.00 G[Hz]; L=4.00 n[H]; C=600 f[F]; R1=2.00 [Ω]; a capacitance of the variable capacitance device Cv=6.28 p[F]; Rc=300 [f], Rc'=1.1 [Ω] (see Equation 3); and C'=6.56 p[F] (see Equation 4).

Figure 17:
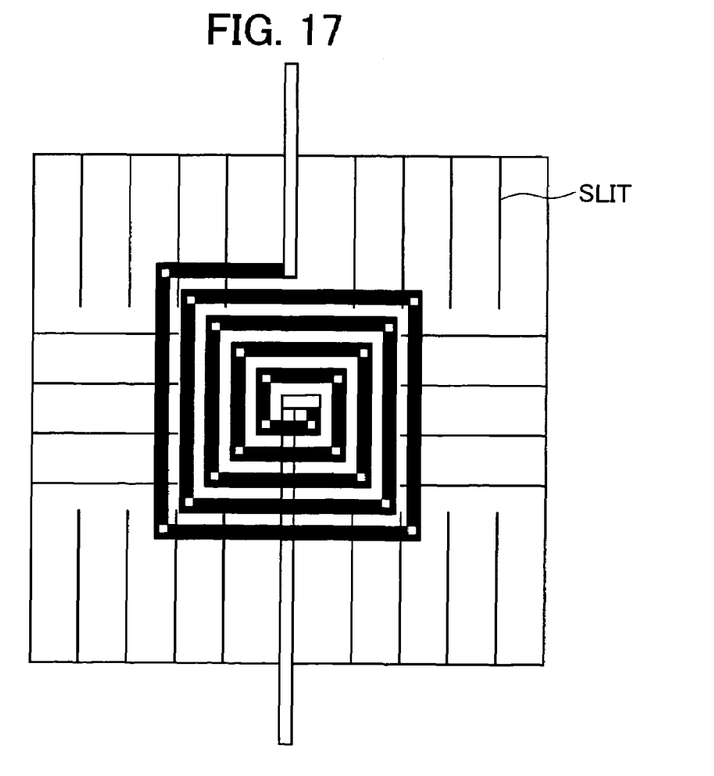
FIG. 17 is a plan view illustrating a conventional GND pattern.

In the case (ii), the metal wires are stacked in multiple levels. Therefore, the C, derived from the parasitic capacitance of the metal wires, is greater than the C of the conventional case (iii) (twice as great as the C of the conventional case (iii)). On the other hand, the total resistance R1 of the metal wires is smaller than that of the conventional case (iii) (half the resistance of the conventional case (iii)). Further, unlike the case (i), the Rc is greater than that of the case (i) (30,000 times as great as the Rc of the case (i)) because the GND pattern has slits (see FIG. 17). Note that, the Cv is set to be smaller than that of the conventional case (iii), by an amount of the added parasitic capacitance.

In the case (ii), the Q of the resonant circuit is approximately 7.96. It is expected that the Q will be improved to be approximately 1.45 times as great as that of the conventional case (iii). Normally, a phase noise characteristic (phase noise) is obtained by the following Leeson's equation:

$$PhaseNoise \propto \frac{1}{4Q^2}\left(\frac{\omega o}{\Delta \omega}\right)^2$$

From the above equation, it is assumed that the Q will be effective to the phase noise by calculating $(1/Q)^2$. Thus, noise-power ratio improves by −10 log (the Q of the case (ii)/the Q of the conventional case (iii))$^2$, and it is expected that the phase noise will be improved by approximately 3.2 dB.

The case (i) of the present invention is set under the following conditions where: a desired frequency=1.00 G[Hz]; L=4.00 n[H]; C=600 f[F]; R1=2.00 [Ω]; a capacitance of the variable capacitance device Cv=5.96 p[F]; Rc=$1.00 \times 10^{-2}$; Rc'=$8.36 \times 10^{-5}$ [Ω] (see Equation 3); and C'=6.56 p[F] (see Equation 4). In the case (ii), the metal wires are stacked in the multiple levels. Therefore, the C, derived from the parasitic capacitance of the metal wires, is greater than the C of the conventional case (iii) (twice as great as the C of the conventional case (iii)). On the other hand, the total resistance R1 of the metal wires is smaller than that of the conventional case (iii) (half the resistance of the conventional case (iii)). Further, unlike the case (ii), The Rc is smaller than that of the case (ii) (1/30000th of the Rc of the case (ii)) because the full-surface GND patter is formed (see FIG. 17). Note that, the Cv is set to be smaller than that of the conventional case (iii), by an amount of the added parasitic capacitance.

In the case (i), the Q of the resonant circuit is approximately 12.3. It is expected that the Q will be improved to be approximately 2.25 times as great as that of the conventional case (iii). Further, from the Equation (5), noise power ratio improves −10 log (the Q of the case (ii)/the Q of the conventional case (iii))$^2$, and it is expected that the phase noise will be improved by approximately 7 dB.

With the foregoing structures, the inductor 1 and the inductor 10 have more parasitic capacitance between the metal wires and the semiconductor substrate, compared to the conventional case (iii). However, the inductor 1 and the inductor 10 allows the Q of the resonator to be improved and the phase noise to be reduced, due to the multilayered metal wires and the formation of the full-surface GND patter.

In the structure described as conventional art, normally, by using the GND pattern having slits in a direction orthogonal to a direction of the magnetic field, the Rc is increased while the parasitic capacitance C between the semiconductor substrate and the metal wires is made to be relatively low. This is because the Q of the coil L itself is effectively increased by increasing an impedance Z (Z=1/jωC+Rc) in a portion where the substrate capacitance (oxide film capacitance) C and the substrate resistance Rc are connected in series (see FIG. 6) and thereby causing the C and the Rc to be insignificant. On the other hand, the inductor 1 and the inductor 10 according to the present embodiment decrease the Rc while increasing the parasitic capacitance C of the inductor itself. That is, the inductor 1 increases the parasitic capacitance C, but significantly decreases the resistance of the metal wires. This increases the Q of the resonator incorporating the inductor 1. The inductor 10 decreases the Rc by using the full-surface GND pattern. This further increases the Q of the resonator. Assume that the inductor of the present embodiment is used in a resonator, in which the variable capacitance device (e.g. variable condenser) and an inductor are supposed to be provided in parallel (e.g. see FIG. 16, resonator used in a voltage controlled oscillator or the like). In this arrangement, increasing amount of the parasitic capacitance caused by the multilayered coil patterns becomes smaller than decreasing amount of the wiring resistance (R1) caused by the multilayered coil patterns. Further, the full-surface GND patter is formed and thereby the Rc is decreased. As a result, the total Q of the resonant circuit is significantly increased.

Meanwhile, a radio-frequency integrated circuit (RF circuit), in which an oscillator containing a resonant circuit (e.g. VCO) is formed, has often employed a compound semiconductor made of GaAs or other compounds. GaAs has a high mobility of electrons and a good high-frequency response. That is, a logic circuit and a radio-frequency integrated circuit, which are realized by a silicon process, have been formed in separate semiconductor devices, and rarely combined on a single semiconductor device.

In recent years, however, technological advances have realized (i) fine patterning in the silicon process or the like and (ii) a transistor having a good high-frequency response. This allows for realization of the radio-frequency integrated circuit on the silicon substrate or the like. In this way, it has become possible to combine, on a single substrate (e.g. silicon substrate), the logic circuit and the radio-frequency circuit which are realized by a silicon process. This increases the possibility of degradation in high-frequency response caused by the noise generated in the logic circuit being mixed in an inductor of the oscillator (in the radio-frequency circuit) through the substrate.

Figure 13:
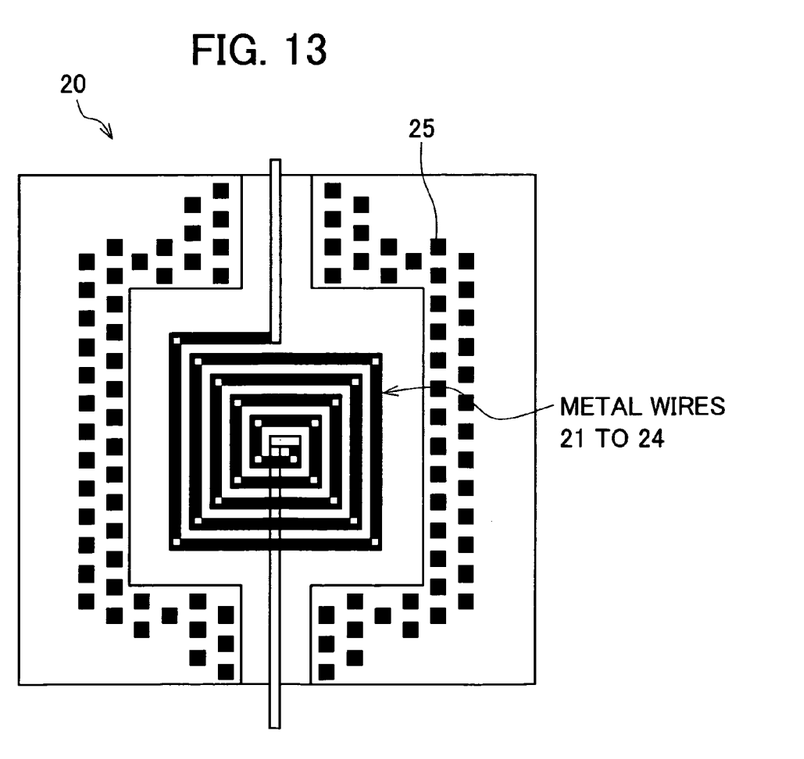
FIG. 13 is a top view illustrating a modification example of the inductor illustrated in FIG. 1.

Regarding this, the inductor 1 and the inductor 10 can be configured to be shielded as illustrated in FIG. 13. In an inductor 20 illustrated in FIG. 13, via holes 25 (shielding via holes) are formed around the first to fourth metal wires 21 to 24.

Figure 14:
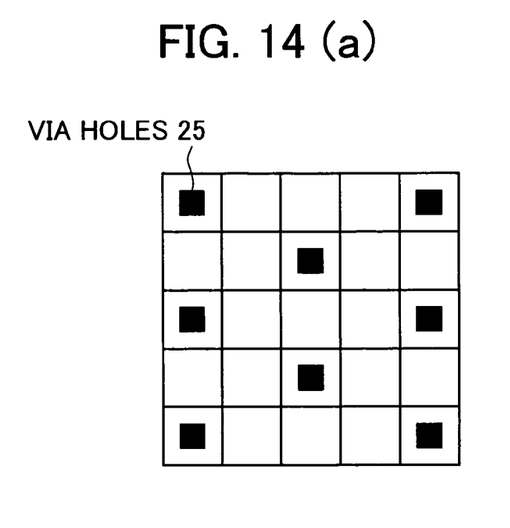
FIG. 14(a) is a top view schematically illustrating via holes arranged in a staggered manner.
FIG. 14(b) is a view schematically illustrating a comparative structure of the structure illustrated in FIG. 14(a).
Figure 15:
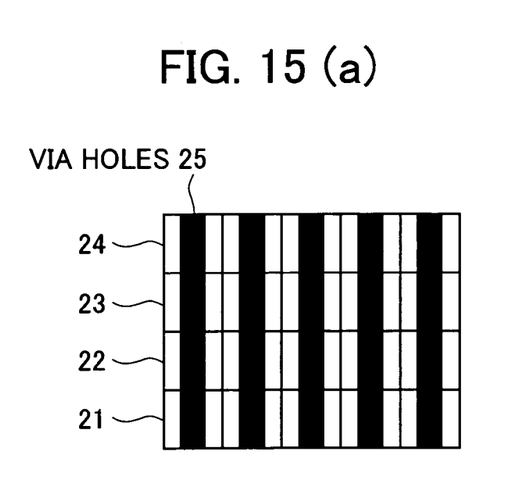
FIG. 15(a) is a side view schematically illustrating via holes arranged in a staggered manner.
FIG. 15(b) is a view schematically illustrating a comparative structure of the structure illustrated in FIG. 15(a).

Due to the design rules of the semiconductor layout process, the via holes have to be spaced from each other at regular intervals. Therefore, if the via holes are provided simply at a regular intervals around the metal wires, gaps are generated between the via holes, corresponding to the intervals (intervals according to the process design rules). FIG. 14(b) illustrates an arrangement where the via holes are provided around the metal wires in only a single row. In this arrangement, the noise shield effect is obtained more, compared to an arrangement where no via holes are provided around the metal wires. However, as illustrated in FIG. 15(b), there are gaps between the via holes, corresponding to the intervals of the process design rules, as the metal wires are viewed from a direction orthogonal to a direction along which the metal wires are stacked (direction along surfaces of the insulating layers of the insulating layers). Specifically, in a digital and analog combined semiconductor integrated circuit, it is highly likely that noise is propagated from a digital circuit through the gaps.

Thus, in the inductor 20, the via holes are formed around the metal wires 21 to 24 in a plurality of rows. Further, as illustrated in FIG. 14(a), for example, the via holes in a first row and the via holes in a second row are provided in a staggered manner, and the via holes in a second row and the via holes in a third row are provided in a staggered manner. That is, the via holes in the first row are spaced from each other at the intervals of the process design rules. Further, the via holes in the second row are provided so as to be placed between the via holes in the first row (via holes in the second row are placed so as to bridge the gaps between the via holes in the first row).

In this manner, as illustrated in FIG. 15(a), the surroundings of the metal wires are almost completely filled with the via holes, when viewed from the direction (direction along the surfaces of the insulating layers) orthogonal to the direction along which the metal wires are stacked. This prevents the noise, generated from the digital circuit or the like, from being mixed in the inductor 20.

Figure 16:
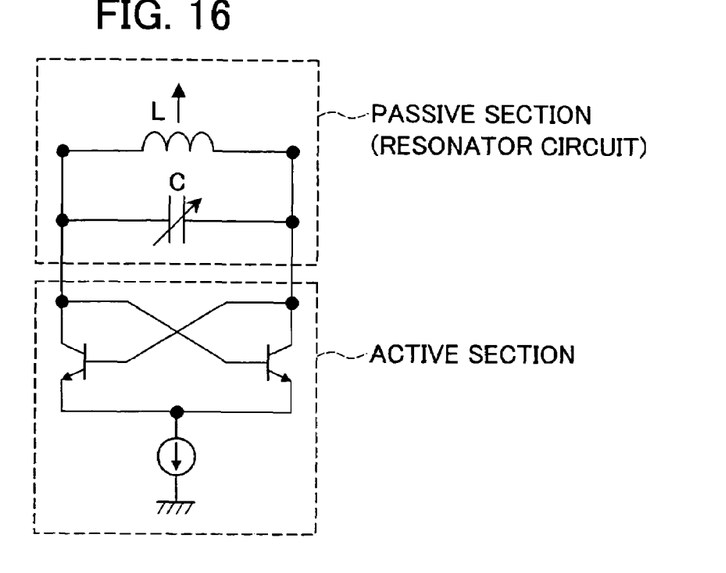
FIG. 16 is a circuit diagram illustrating a voltage controlled resonator incorporating the inductor of the present invention.

The inductors (1, 10, and 20) are used in a voltage controlled oscillator (VCO) as illustrated in FIG. 16, together with a variable capacitance device such as a varactor or the like. The VCO includes a passive section and an active section, which are connected in parallel. In the passive section (resonant circuit), normally, the coil (inductor) L and the variable capacitance device Cv are connected in parallel. Here, considering the wiring resistance and the parasitic capacitance of the inductor, the passive section is arranged to be an equivalent circuit as illustrated in FIG. 7. Further, in the active section, two transistors are crossconnected (emitter terminals of the transistors are connected to each other, while base terminals and collector terminals of the transistors are connected to each other). Together, the common emitter terminal of the transistors is connected to a constant-current power supply, so that a negative resistance circuit is constructed.

In another aspect, the present invention can be expressed as the following inductor structure: an inductor is employed, in the semiconductor process, in a resonator having an inductor element and a variable capacitance device capable of varying its capacitance. The inductor element includes (i) a plurality of insulating layers, (ii) a plurality of metal layers which are electrically insulated from the insulating layers, and (iii) via holes through which the metal layers are electrically connected to each other. In the foregoing structure, at least one of the metal layers serves to draw a terminal of the inductor element, and at least two of the metal layers have the same pattern so as to construct the inductor. Further, the metal layers are connected through the via holes, so as to be stacked in multiple levels. This allows for reduction in the series resistance, applied to each layer of the inductor, though a stray capacitance applied to the inductor is increased. As a result, the Q of the resonator is improved.

As described above, the total series resistance of the inductor can be reduced, by providing coil patterns on at least two of the insulating layers and electrically connecting the coil patterns each other. Accordingly, the reduction in the series resistance improves Q of the inductor itself. Further, the present invention does not cause an increase an area of the circuit because the coil patterns are stacked in multiple levels. This realizes improvement in the Q without increasing the size of the inductor.

Further, when the inductor is employed in a resonator, in which a variable capacitance device and an inductor are supposed to be provided in parallel, the effect of the increased parasitic capacitance due to the multilayered metal wires is reduced. Further, the reduction efficiency of the wiring resistance is significantly increased by the multilayered metal wires. This realizes a resonant circuit having a high Q and a low phase noise.

Further, according to the above arrangement, it is preferable that the coil patterns be electrically connected to each other through a plurality of via holes. Thus, the coil patterns are connected to each other through a plurality of connecting via holes (preferably, multiple connecting via holes provided over the coil pattern). This realizes reduction in the series resistance R1, thereby further improving the Q of the inductor itself.

Further, according to the above arrangement, it is preferable that a plurality of shielding via holes be provided so as to surround the coil patterns. This reduces the noise invading the inductor from other circuit or the like. Specifically, the above arrangement is effective in a monolithic integrated circuit into which (i) a high-frequency circuit including an inductor, (ii) a logic circuit, and (iii) other circuits are combined. This is because digital noise or the like, leaked from the logic circuit, is prevented from invading the inductor through the substrate.

Further, according to the above arrangement, it is preferable that the shielding via holes be provided in a plurality of rows around the coil patterns, and the shielding via holes in adjacent rows be arranged in a staggered manner.

In the case where via holes are formed only in one row around the coil patterns, gaps with a certain distance are generated between the via holes. This is because the via holes are formed according to the design rules (rules for spacing). On the other hand, in the case where the shielding via holes are formed in multiple rows so that the shielding via holes in the adjacent rows are arranged in a staggered manner. This enables bridging the gaps, which appear between the shielding via holes provided only in a single row, thereby reducing noise invading the inductor from other circuit or the like.

Further, the resonant circuit of the present embodiment includes the inductor, and a variable capacitance device provided in parallel to the inductor.

When the inductor is employed in the resonant circuit, in which the variable capacitance device and the inductor are supposed to be provided in parallel, the effect of the increased parasitic capacitance due to the multilayered metal layers is reduced. Further, reduction efficiency of the wiring resistance is increased by the multilayered metal wires. This realizes a resonant circuit having a high Q and a low phase noise.

In the resonant circuit, it is preferable that a full-surface GND pattern be provided below the bottom layer of the insulating layers of the inductor. An example of the full-surface GND patter is a metal film which is uniformly formed over the surface of the semiconductor substrate.

This allows the substrate resistance to be nearly zero, thereby significantly improving the total Q of the resonator.

Further, according to the present embodiment, the semiconductor integrated circuit includes the resonant circuit. An example of the semiconductor integrated circuit is a monolithic integrated circuit in which a high-frequency circuit including the resonant circuit, and a logic circuit are combined on a silicon substrate. The high-frequency circuit and the logic circuit are realized by a silicon process or the like.

Further, the oscillator of the present embodiment includes the resonant circuit. An example of the oscillator is a voltage controlled oscillator (VCO).

Further, the communication apparatus of the present embodiment includes the oscillating circuit. An example of the communication apparatus is a radio frequency transmitter-receiver.

The inductor, the resonant circuit, and the oscillating circuit of the present embodiment are widely applied in radio frequency transmitter-receivers or the like, such as tuners for satellite broadcasts, tuners for cable television broadcasts, tuners for ground waves, wireless LAN apparatus, mobile communication devices, and the like.

What is claimed is:

1. An inductor, comprising:
a plurality of insulating layers being stacked; and
coil patterns being respectively provided on predetermined layers of the insulating layers,
at least two of the insulating layers having the respective coil patterns provided thereon,
the coil patterns being electrically connected to each other,
the coil patterns having a spiral end part and a spiral start part that are respectively connected to leads,
each of the coil patterns being separated at a part so as not to contact the lead connected to the spiral end part,
for a first pattern, no via hole being formed on the leads and their surroundings.

2. The inductor according to claim 1, wherein the coil patterns are electrically connected to each other through a plurality of via holes.

3. The inductor according to claim 1, wherein a plurality of shielding via holes is provided so as to surround the coil patterns.

4. The inductor according to claim 3,
wherein the shielding via holes are provided in a plurality of rows around the coil patterns, and
wherein the shielding via holes in adjacent rows are arranged in a staggered manner.

5. A resonant circuit, comprising:
an inductor; and
a variable capacitance device being provided in parallel to the inductor,
the inductor including: a plurality of insulating layers being stacked; and coil patterns respectively provided on predetermined layers of the insulating layers,
at least two of the insulating layers having the respective coil patterns being provided thereon,
the coil patterns being electrically connected to each other,
the coil patterns having a spiral end part and a spiral start part that are respectively connected to leads,
each of the coil patterns being separated at a part so as not to contact the lead connected to the spiral end part,
for a first pattern, no via hole being formed on the leads and their surroundings.

6. The resonant circuit according to claim 5, wherein a full-surface GND pattern is provided below the bottom layer of the insulating layers of the inductor.

7. A semiconductor integrated circuit, comprising a resonant circuit, the resonant circuit including:
an inductor; and
a variable capacitance device being provided in parallel to the inductor,
the inductor having: a plurality of insulating layers being stacked: and coil patterns respectively provided on predetermined layers of the insulating layers,
at least two of the insulating layers having the respective coil patterns being provided thereon, and the coil patterns being electrically connected to each other, the coil patterns having a spiral end part and a spiral start part that are respectively connected to leads, each of the coil patterns being separated at a part so as not to contact the lead connected to the spiral end part, for a first pattern, no via hole being formed on the leads and their surroundings.

8. An oscillator, comprising a resonant circuit, the resonant circuit including:

an inductor; and a variable capacitance device being provided in parallel to the inductor, the inductor having: a plurality of insulating layers being stacked; and coil patterns respectively provided on predetermined layers of the insulating layers, at least two of the insulating layers having the respective coil patterns being provided thereon, and the coil patterns being electrically connected to each other, the coil patterns having a spiral end part and a spiral start part that are respectively connected to leads, each of the coil patterns being separated at a part so as not to contact the lead connected to the spiral end part, for a first wire, no via hole being formed on the leads and their surroundings.

9. A communication apparatus, comprising an oscillator, the oscillator including a resonant circuit having: an inductor; and a variable capacitance device being provided in parallel to the inductor, the inductor having: a plurality of insulating layers being stacked; and coil patterns respectively provided on predetermined layers of the insulating layers, at least two of the insulating layers having the respective coil patterns being provided thereon, and the coil patterns being electrically connected to each other, the coil patterns having a spiral end part and a spiral start part that are respectively connected to leads, each of the coil patterns being separated at a part so as not to contact the lead connected to the spiral end part, for a first pattern, no via hole being formed on the leads and their surroundings.

* * * * *